(12) United States Patent
Ning

(10) Patent No.: US 11,915,784 B2
(45) Date of Patent: Feb. 27, 2024

(54) MEMORY CHIP AND MEMORY SYSTEM

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 188 days.

(21) Appl. No.: 17/662,414

(22) Filed: May 6, 2022

(65) Prior Publication Data
US 2023/0178123 A1 Jun. 8, 2023

(30) Foreign Application Priority Data
Dec. 8, 2021 (CN) .......................... 202111493167.2

(51) Int. Cl.
*G11C 7/00* (2006.01)
*G11C 7/10* (2006.01)
*G11C 7/06* (2006.01)
*G11C 7/14* (2006.01)

(52) U.S. Cl.
CPC ............ *G11C 7/1093* (2013.01); *G11C 7/062* (2013.01); *G11C 7/1066* (2013.01); *G11C 7/14* (2013.01)

(58) Field of Classification Search
CPC ..... G11C 7/1093; G11C 7/062; G11C 7/1066; G11C 7/14
USPC .......................................................... 365/194
See application file for complete search history.

(56) References Cited

U.S. PATENT DOCUMENTS

2009/0027065 A1* 1/2009 Kuang ................... G11C 29/50
 324/617
2011/0208990 A1* 8/2011 Zerbe ........................ G06F 1/08
 710/53

FOREIGN PATENT DOCUMENTS

CN 112947669 A 6/2021

* cited by examiner

*Primary Examiner* — Vu A Le
(74) *Attorney, Agent, or Firm* — Syncoda LLC; Feng Ma

(57) ABSTRACT

A memory chip is applied to the memory system, and the memory chip is configured to perform counting and obtain a count value after the memory chip is powered on and started, wherein the count value is used to represent a process corner of the memory chip, the memory chip further has a reference voltage with an adjustable value, the value of the reference voltage is adjustable based on the count value, and the memory chip adjusts, based on the reference voltage, a delay from reading out data from a memory cell to outputting the data through a data port.

18 Claims, 7 Drawing Sheets

MEMORY CHIP AND MEMORY SYSTEM

CROSS-REFERENCE TO RELATED APPLICATIONS

This application claims priority to Chinese Patent Application No. 202111493167.2 filed on Dec. 8, 2021, the disclosure of which is hereby incorporated by reference in its entirety.

BACKGROUND

Semiconductor memories may be classified into non-volatile memories and volatile memories. A dynamic random-access memory (DRAM), as a volatile memory, has advantages of a high storage density and a fast read and write speed, and is widely used in various electronic systems.

A DRAM system usually includes a controller and a plurality of memory chips. Performance of different memory chips varies with manufacturing processes and other differences. This affects the overall performance of the DRAM system.

SUMMARY

Embodiments of the present disclosure relate to the technical field of semiconductors, and in particular to a memory chip and a memory system.

Embodiments of the present disclosure provide a memory chip and a memory system.

According to some embodiments of the present disclosure, a first aspect of the embodiments of the present disclosure provides a memory chip, applied to a memory system. The memory chip is configured to perform counting and obtain a count value after the memory chip is powered on and started, wherein the count value is used to characterize a process corner of the memory chip, the memory chip further has a reference voltage with an adjustable value, the value of the reference voltage is adjustable based on the count value, and the memory chip adjusts, based on the reference voltage, a delay from reading out data from a memory cell to outputting the data through a data port.

According to some embodiments of the present disclosure, another aspect of the embodiments of the present disclosure provides a memory system, including a plurality of memory chips provided in the foregoing embodiments; and a controller, wherein the controller is configured to: obtain the count value of the memory chip, and adjust, based on the count value, the value of the reference voltage of the memory chip corresponding to the count value.

BRIEF DESCRIPTION OF THE DRAWINGS

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

DETAILED DESCRIPTION

Figure 1:
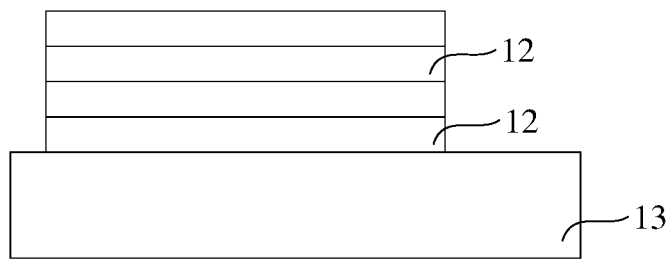
FIG. 1 is a schematic structural diagram of a memory system.
Figure 2:
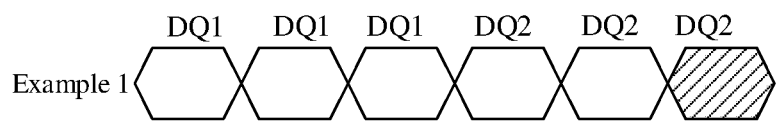
FIG. 2 is a schematic diagram of data transmission in the memory system according to FIG. 1.
Figure 2:
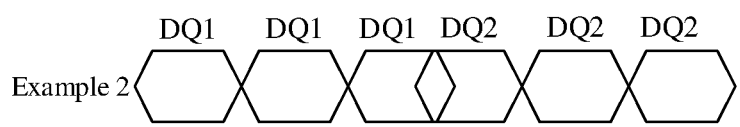

FIG. 1 is a schematic structural diagram of a memory system. FIG. 2 is a schematic diagram of data transmission in the memory system according to FIG. 1. Referring to FIG. 1, the memory system may include: a controller 13; and a plurality of memory chips 12 that are located on a surface of the controller 13 and that are provided in a stacked manner, wherein the memory chip 12 may be a DRAM chip.

Because different memory chips 12 vary in process, electrical properties showed by the different memory chips 12 are also different, for example, threshold voltages or on-currents of transistors in the different memory chips 12 are different, resulting in different delays of data transmission inside the different memory chips 12. This causes data signals received by the controller 13 from the different memory chips 12 to be skewed, levels of different data signals to be inconsistent, the data signals of the different memory chips 12 to have a conflict, and so on, affecting overall performance of the memory system. Specifically, referring to FIG. 2, an example 1 in FIG. 2 is a schematic diagram of ideal transmission of data signals corresponding to two memory chips 12, wherein DQ1 and DQ2 are respectively the data signals that correspond to the different memory chips 12 and that are transmitted to the controller 13; and an example 2 in FIG. 2 is an example diagram of actual transmission of the data signals corresponding to the two memory chips 12, wherein DQ1 corresponds to a memory chip 12 with a slow process corner, and DQ2 corresponds to a memory chip 12 with a fast process corner. In an actual transmission process, data of DQ2 starts to be transmitted before transmission of data of DQ1 is finished. This leads to a data conflict between DQ1 and DQ2, causing storage performance of the memory system to deteriorate.

Based on this, an embodiment of the present disclosure provides a memory chip. The memory chip is applied to a memory system, and a reference voltage in the memory chip for controlling a data transmission delay is adjustable based on a count value for representing a process corner, to resolve a data conflict problem of the memory system, and improve uniformity of alignment of data signals, thereby improving read and write performance of the memory system.

In order to make the objectives, technical solutions and advantages of the embodiments of the present disclosure clearer, the embodiments of the present disclosure are described below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 3:
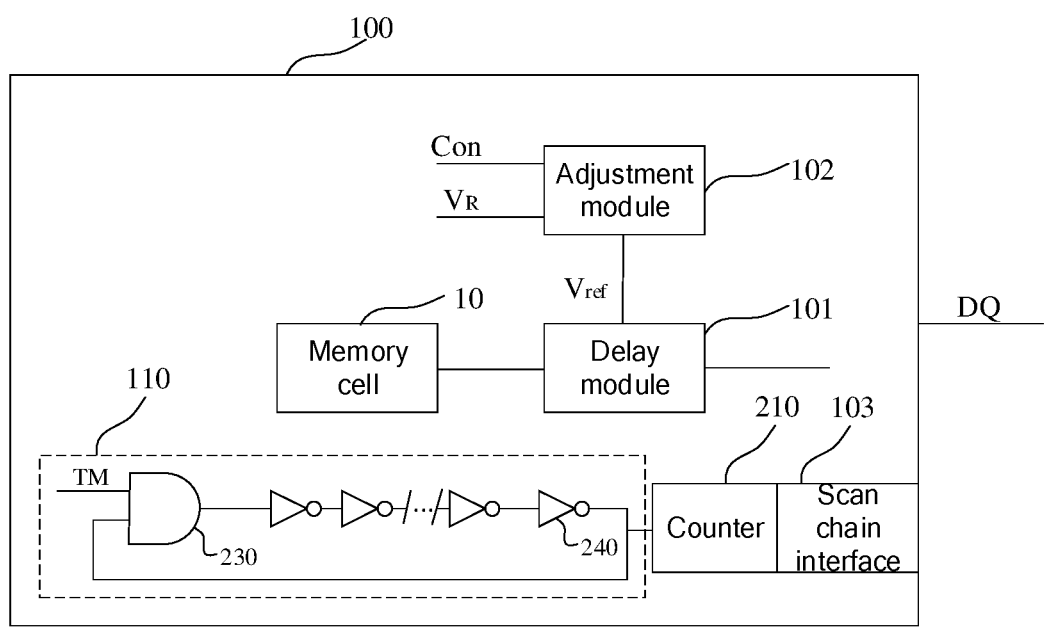
FIG. 3 is a schematic structural diagram of a memory chip according to an embodiment of the present disclosure.

FIG. 3 is a schematic structural diagram of a memory chip according to an embodiment of the present disclosure.

Referring to FIG. 3, a memory chip 100 provided in an embodiment of the present disclosure is applied to a memory system, and the memory chip 100 is configured such that the memory chip 100 performs counting and obtain a count value after being powered on and started, wherein the count value is used to represent a process corner of the memory chip 100, the memory chip 100 further has a reference voltage $V_{ref}$ with an adjustable value, the value of the reference voltage $V_{ref}$ is adjustable based on the count value, and the memory chip 100 adjusts, based on the reference voltage $V_{ref}$, a delay from reading out data from a memory cell 10 to outputting the data through a data port DQ.

The reference voltage $V_{ref}$ is related to the delay from reading out the data from the memory cell 10 to outputting the data through the data port DQ. Specifically, for a same memory chip 100 or a same memory chip 100 with a same process corner, a higher reference voltage $V_{ref}$ indicates a smaller delay from reading out the data from the memory cell 10 to outputting the data through the data port DQ. That is, different memory chips 100 have a problem of different delays of the chips caused by different process corners, a memory chip 100 with a slow process corner has a larger delay, and a memory chip 100 with a fast process corner has a smaller delay. In this embodiment of the present disclosure, different count values correspond to different process corners. Since the reference voltage $V_{ref}$ is adjustable based on the count value, the delay can be compensated based on the process corner of the memory chip 100, such that consistency of delays of the memory chips 100 is improved. Specifically, if the count value represents that a process corner of the memory chip 100 is a slow process corner, the reference voltage $V_{ref}$ of the memory chip 100 is increased to shorten a data delay of the memory chip 100 with the slow process corner; if the count value represents that a process corner of the memory chip 100 is a fast process corner, the reference voltage $V_{ref}$ of the memory chip 100 is lowered to prolong a data delay of the memory chip 100 with the fast process corner. In this way, reference voltages $V_{ref}$ of different memory chips 100 are compensated accordingly based on process corners, such that actual delays of the memory chips 100 tend to be consistent or completely consistent. In this way, data transmission delays of the different memory chips 100 meet an expectation, thereby improving uniformity of data signals, preventing a problem of a data transmission conflict between the different memory chips 100 from occurring, and improving read and write performance of the memory system.

The memory chip 100 provided in the embodiments of the present disclosure is described in more detail below with reference to the accompanying drawings.

In some embodiments, the memory chip 100 may be a DRAM memory chip, such as a double data rate (DDR) 4 DRAM memory chip or a DDR5 DRAM memory chip. In other embodiments, the memory chip 100 may alternatively be a static random-access memory (SRAM) memory chip, a NAND memory chip, a NOR memory chip, a FeRAM memory chip, or a PcRAM memory chip.

The design of the memory chip 100 needs to meet conditions such as a process corner, a voltage, and a temperature, and a combination formed by the process corner, the voltage, and the temperature is referred to as a process, voltage, and temperature (PVT) condition.

In some embodiments, if a 5-process corner model is adopted, process corners of different memory chips 100 can be classified into a typical NMOS and typical PMOS (TT) process corner, a fast NMOS and fast PMOS (FF) process corner, a slow NMOS and slow PMOS (SS) process corner, a fast NMOS and slow PMOS (FS) process corner, and a slow NMOS and fast PMOS (SF) process corner. Typical means that a drive current is of an average value, Fast means that a drive current is of a maximum value. Slow means that a drive current is of a minimum value (this drive current is an Ids current). This is explained from a measurement point of view. Typical, Fast and Slow are also understood as a speed of carrier mobility, and the carrier mobility refers to an average drift speed of carriers under an action of a unit electric field.

Referring to FIG. 3, the memory chip 100 may include: a ring oscillator 110; and a counter 210, wherein the counter 210 is connected to the ring oscillator 110, and is configured to count an oscillation period of the ring oscillator 110 to obtain the count value within a preset time.

Specifically, an enable signal TM of the ring oscillator 110 may be sent out by the controller. An oscillation speed of the ring oscillator 110 is related to the process corner of the memory chip 100. If the process corner is a fast process corner, the ring oscillator 110 oscillates faster, or if the process corner is a slow process corner, the ring oscillator 110 oscillates slower. The counter 210 counts the oscillation period of the ring oscillator 110 within the present time, such that the oscillation speed of the ring oscillator 110 can be reflected through the count value. It may be understood that the preset time may be a range of values, but for different memory chips 100 of a same memory system, the preset time should be a same fixed value to ensure that count values are obtained within a same length of time period.

In other embodiments, the enable signal TM of the ring oscillator 110 may alternatively be provided by the inside of the memory chip 100, for example, that the memory chip 100 is powered on and started may be used as an excitation condition for providing the enable signal TM to the ring oscillator 110.

In some embodiments, the ring oscillator 110 may include: an AND gate 230, wherein one input terminal of the AND gate 230 receives the enable signal TM; and a plurality of cascaded inverters 240 connected in series, wherein an input terminal of the cascaded inverter 240 located at the first position is connected to an output terminal of the AND gate 230, an output terminal of the cascaded inverter 240 at the tail position is connected to the other input terminal of the AND gate 230, and the output terminal of the cascaded inverter 240 at the tail position is further connected to the counter 210. Specifically, if the ring oscillator 110 oscillates once, the counter 210 counts once.

There may be an odd number of cascaded inverters 240.

In some embodiments, the counter 210 may be an addition counter. It should be noted that, the counter 210 may further have a reset terminal, configured to receive a reset signal, wherein the reset signal may be sent out by the controller, such that the counter 210 is first reset before performing counting. This ensures that initial values of counters 210 of different memory chips 100 are the same before counting is performed, and may further ensure that a counter 210 of a same memory chip 100 in different test stages has a same initial value before counting is performed.

In some embodiments, the counter 210 may further include a latch module, configured to lock the count value. In this way, after the memory system is powered on and started, the memory chip 100 may first obtain the count value and store the count value, and only after a particular time length, the controller invokes the count value to obtain a process corner of the memory chip 100, to facilitate adjustment of a reference voltage of the memory chip 100. This helps improve testing flexibility of the memory system and allows all of the memory chips 100 to simultaneously obtain corresponding count values.

In some embodiments, the data has a readout path, the readout path includes a process in which the data is read out from the memory cell 10 and output through the data port DQ, and the data transmitted on the readout path is defined as intermediate data; and the memory chip 100 includes: a delay module 101, wherein the delay module 101 is provided on the readout path, an input terminal receives the intermediate data, a control terminal receives the reference voltage $V_{ref}$, an output terminal outputs the intermediate data based on the reference voltage $V_{ref}$, and a length of the delay of the delay module 101 from receiving the intermediate data to outputting the intermediate data corresponds to the value of the reference voltage $V_{ref}$; and an adjustment module 102, wherein an output terminal of the adjustment module 102 is connected to the control terminal of the delay module 101, an input terminal receives a preset reference voltage $V_R$, a control terminal receives a control signal Con, and the output terminal outputs, based on the control signal Con and the preset reference voltage $V_R$, the reference voltage $V_{ref}$ with the adjustable value.

The data delay can be controlled, through the delay module 101, on any transmission path on the readout path of the data, such that the design of the memory chip 100 is more flexible; and the reference voltage $V_{ref}$ with the adjustable value can be output through the adjustment module 102 based on the preset reference voltage $V_R$ and the control signal Con, wherein the preset reference voltage $V_R$ may be a preset reference voltage specified in an operation manual of the memory chip 100, that is, the preset reference voltage may be a voltage value designed for the memory chip 100 under an ideal condition.

Specifically, there may be a drive module, a buffer module, a latch module, and the like on the readout path of the data, and the delay module 101 may be provided at any position of the readout path, for example, may be provided at a previous stage or a next stage of the drive module, may be provided at a previous stage or a next stage of the buffer module, may be provided at a previous stage or a next stage of the latch module, or may be provided inside the drive module, the buffer module, or the latch module. The control signal Con may be given by a controller of the memory system, and the control signal Con is further related to the process corner of the memory chip 100.

Figure 4:
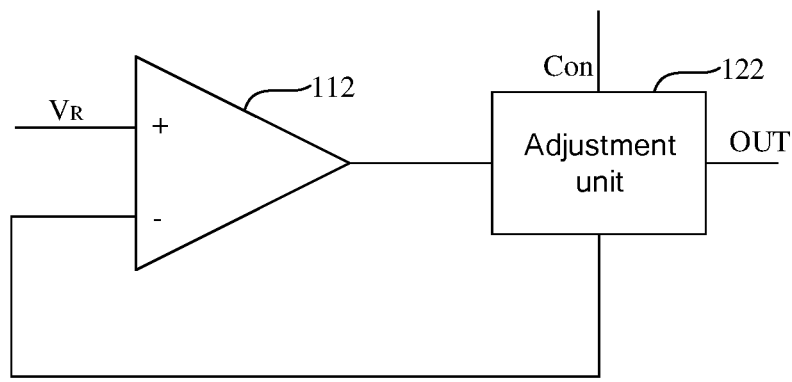
FIG. 4 is a schematic structural diagram of an adjustment module in a memory chip according to an embodiment of the present disclosure.

FIG. 4 is a schematic structural diagram of an adjustment module in a memory chip according to an embodiment of the present disclosure. Referring to FIG. 4, in some embodiments, the adjustment module 102 may include an operational amplifier 112, wherein a positive input terminal of the operational amplifier 112 receives the preset reference voltage $V_R$, and an adjustment unit 122, wherein the adjustment unit 122 is connected to a negative input terminal and an output terminal of the operational amplifier 112, and an output terminal OUT of the adjustment unit 122 outputs the reference voltage $V_{ref}$, and further adjusts, based on the control signal, a value of an equivalent resistance between the output terminal OUT of the adjustment unit 122 and the output terminal of the operational amplifier 112, or a value of an equivalent resistance between the output terminal of the adjustment unit 122 and a ground terminal.

According to the "virtual short" principle of the operational amplifier, a voltage of the negative input terminal of the operational amplifier 112 is the same as a voltage of the positive input terminal. The reference voltage $V_{ref}$ with the adjustable value is obtained through a structure of the operational amplifier 112 and the adjustment unit 122, such that a circuit structure of the adjustment module 102 is simple, and an area of the memory chip 100 occupied by the adjustment module 102 is small, which is beneficial to reducing a chip area of the memory chip 100. Specifically, this is beneficial to reducing a chip area of the memory chip 100. Specifically, the equivalent resistance between the output terminal OUT of the adjustment unit 122 and the ground terminal is defined to be R1, and the equivalent resistance between the negative input terminal of the operational amplifier 112 and the ground terminal is defined to be R2. In this case, the reference voltage $V_{ref}$ and the preset reference voltage $V_R$ meet the following relationship:

$$V_{ref}=(V_R/R2)*R1 \qquad (1)$$

The value of the reference voltage $V_{ref}$ can be adjusted by adjusting at least one of R1 or R2. Therefore, a value of R1 can be selected to be adjusted, and a value of R2 can be selected to be adjusted, or values of R1 and R2 are simultaneously adjusted, to adjust the value of the reference voltage $V_{ref}$.

Figure 5:
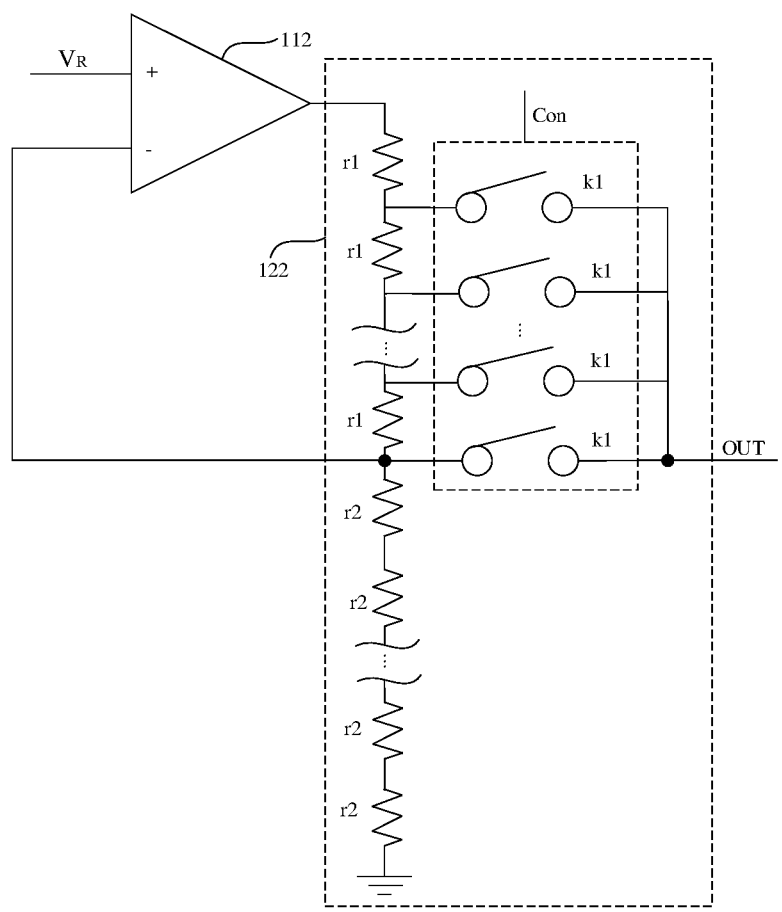
FIG. 5 is a schematic diagram of a circuit structure of an adjustment module in a memory chip according to an embodiment of the present disclosure.

Referring to FIG. 5, FIG. 5 is a schematic diagram of a circuit structure of an adjustment module. The adjustment unit 122 may include N first resistors r1 connected in series between the negative input terminal and the output terminal of the operational amplifier 112, wherein N is an integer greater than 1, and at least one second resistor r2, wherein the second resistor r2 is connected between the negative input terminal and the ground terminal; and M first switches k1, wherein the first switch k1 connects the output terminal OUT of the adjustment unit 122 and a terminal of a corresponding first resistor r1, and the first switch k1 is selectively turned on based on the control signal Con, to adjust the value of the equivalent resistance between the output terminal of the adjustment unit 122 and the output terminal of the operational amplifier 112, wherein M is a positive integer less than or equal to N. N may be any natural number, such as 2, 3, or 4, greater than 1, and M may be any natural number such as 1, 2, or 3.

The first switch k1 may be a MOS transistor or a transmission gate. It should be noted that resistances of the first resistors r1 may be the same or different; and resistances of the second resistors r2 may be the same or different. The value of the equivalent resistance between the output terminal OUT of the adjustment unit 122 and the output terminal of the operational amplifier 112 varies according to different turned-on conditions of the first switches k1.

Referring to FIG. 5, according to the "virtual short" principle of the operational amplifier, the voltage of the negative input terminal of the operational amplifier 112 is the same as the voltage of the positive input terminal, that is, the voltage of the negative input terminal is $V_R$. Based on the voltage of the negative input terminal and a resistance of the negative input terminal to the ground terminal, a current from the negative input terminal to the ground terminal may be obtained. This current is also a current on a path from the output terminal of the operational amplifier 112 to the ground terminal. Only one of the plurality of first switches k1 is turned on. Based on different turned-on conditions of the first switches k1, with reference to the current and the equivalent resistance between the output terminal OUT of the adjustment unit 122 and the ground terminal, the reference voltage $V_{ref}$ output by the output terminal OUT of the adjustment unit 122 may be calculated. For example, if the first switch k1 connected to a node connecting the first resistor r1 and the second resistor r2 is turned on, the reference voltage $V_{ref}$ output by the output terminal OUT of the adjustment unit 122 is the same as the preset reference voltage $V_R$.

In addition, the larger the numbers of the first resistors r1 and the first switches k1, the more gears of the value of the reference voltage $V_{ref}$ output by the adjustment module 102, the more gears that can be adjusted accordingly for the data transmission delay, and the more beneficial to obtaining, through adjustment, a data delay matching a requirement. In a specific actual circuit, the area of the memory chip 100 occupied by the adjustment module 102 should also be considered. If the numbers of the first resistors r1 and the first switches k1 are excessively large, the area of the memory chip 100 is increased accordingly. For this, the numbers of the first resistors r1 and the first switches k1 may be properly selected based on the foregoing two requirements.

Figure 6:
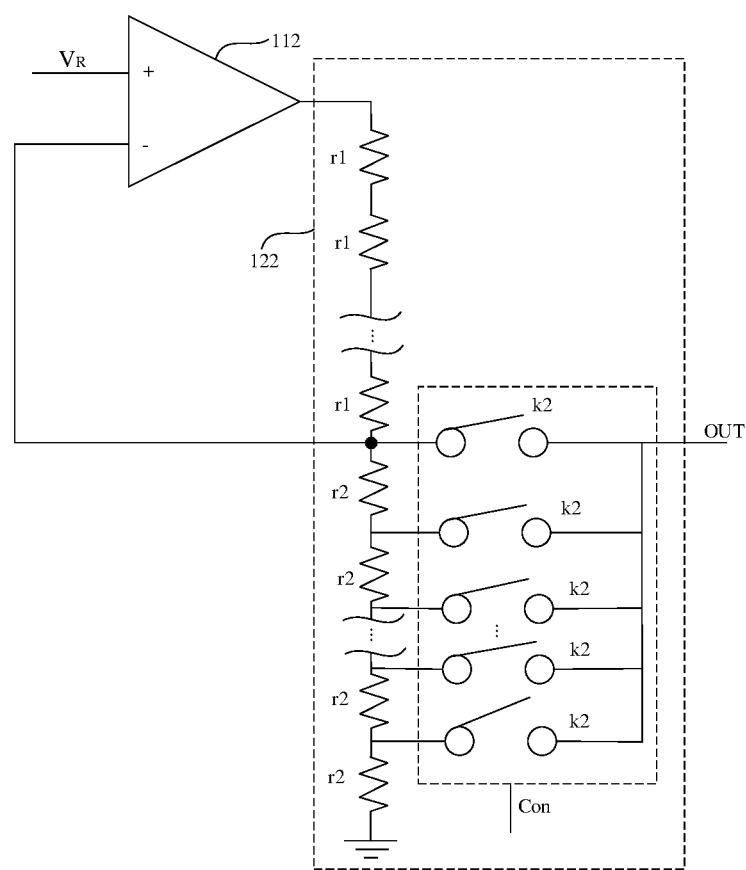
FIG. 6 is a schematic diagram of another circuit structure of an adjustment module in a memory chip according to an embodiment of the present disclosure.

Referring to FIG. 6, FIG. 6 is a schematic diagram of another circuit structure of an adjustment module. The adjustment unit 122 includes: X second resistors r2 connected in series between the negative input terminal and the ground terminal, wherein X is a positive integer greater than 1; and Y second switches k2, wherein the second switch k2 connects the output terminal OUT of the adjustment unit 122 and a terminal of a corresponding second resistor r2, and the second switch k2 is selectively turned on based on the control signal Con, to adjust the value of the equivalent resistance between the output terminal OUT of the adjustment unit 122 and the ground terminal, wherein Y is a positive integer less than or equal to X. X may be any natural number, such as 2, 3, or 4, greater than 1, and Y may be any natural number such as 1, 2, or 3.

The second switch k2 may be a MOS transistor or a transmission gate. It should be noted that resistances of the second resistors r2 may be the same or different. The value of the equivalent resistance between the output terminal OUT of the adjustment unit 122 and the ground terminal varies according to different turned-on conditions of the second switches k2.

In addition, the larger the numbers of the second resistors r2 and the second switches k2, the more gears of the value of the reference voltage $V_{ref}$ output by the adjustment module 102, the more gears that can be adjusted accordingly for the data transmission delay, and the more beneficial to obtaining, through adjustment, a data delay matching a requirement. In a specific actual circuit, the area of the memory chip 100 occupied by the adjustment module 102 should also be considered. If the numbers of the second resistors r2 and the second switches k2 are excessively large, the area of the memory chip 100 is increased accordingly. For this, the numbers of the second resistors r2 and the second switches k2 may be properly selected based on the foregoing two requirements.

Referring to FIG. 6, in some embodiments, the adjustment unit 122 may further include at least one first resistor r1, the first resistor r1 is connected between the negative input terminal and the output terminal of the operational amplifier 112, and for a case in which there are a plurality of first resistors r1, the plurality of first resistors r1 are connected in series.

Referring to FIG. 6, according to the "virtual short" principle of the operational amplifier, the voltage of the negative input terminal of the operational amplifier 112 is the same as the voltage of the positive input terminal. For a calculation manner of the output terminal OUT of the adjustment unit 122, refer to the foregoing related description.

Figure 7:
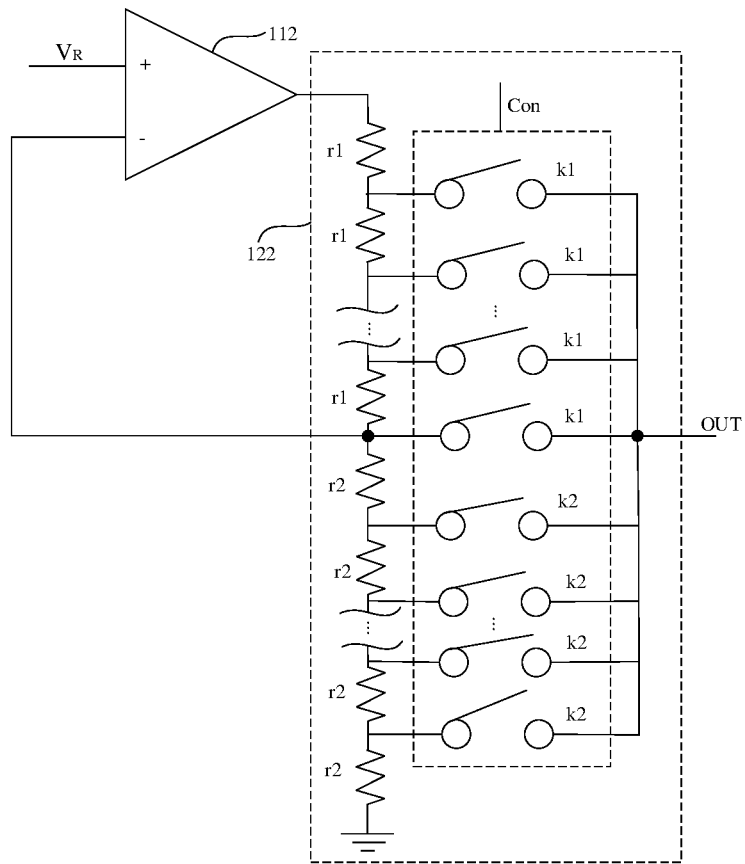
FIG. 7 is a schematic diagram of still another circuit structure of an adjustment module in a memory chip according to an embodiment of the present disclosure.

Referring to FIG. 7, FIG. 7 is another schematic structural diagram of an adjustment module. In some embodiments, the adjustment unit 122 may include: N first resistors r1 connected in series between the negative input terminal and the output terminal of the operational amplifier 112, wherein N is an integer greater than 1; M first switches k1, wherein the first switch k1 connects the output terminal OUT of the adjustment unit 122 and a terminal of a corresponding first resistor r1, and the first switch k1 is selectively turned on based on the control signal Con, to adjust the value of the equivalent resistance between the output terminal OUT of the adjustment unit 122 and the output terminal of the operational amplifier 112, wherein M is a positive integer less than or equal to N; X second resistors r2 connected in series between the negative input terminal and the ground terminal, wherein X is a positive integer greater than 1; and Y second switches k2, wherein the second switch k2 connects the output terminal OUT of the adjustment unit 122 and a terminal of a corresponding second resistor r2, and the second switch k2 is selectively turned on based on the control signal Con, to adjust the value of the equivalent resistance between the output terminal OUT of the adjustment unit 122 and the ground terminal, wherein Y is a positive integer less than or equal to X.

For a calculation manner of the voltage of the output terminal OUT of the adjustment unit 122, refer to the foregoing related descriptions of FIG. 5 and FIG. 6.

Specifically, through the first switch k1 and the second switch k2, not only can the value of the equivalent resistance between the output terminal OUT of the adjustment unit 122 and the output terminal of the operational amplifier 112 be adjusted, but also the value of the equivalent resistance between the output terminal OUT of the adjustment unit 122 and the ground terminal can be adjusted. This is beneficial to adjusting the value of the reference voltage $V_{ref}$ more flexibly, and there are more gears of the reference voltage $V_{ref}$.

Figure 8:
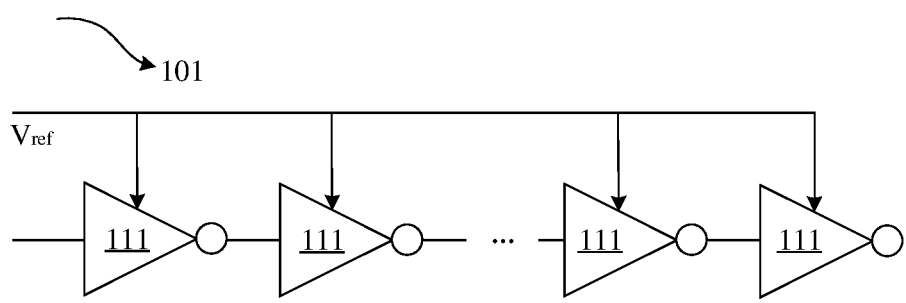
FIG. 8 is a schematic diagram of a circuit structure of a delay module in a memory chip according to an embodiment of the present disclosure.

Referring to FIG. 8, FIG. 8 is a schematic diagram of a circuit structure of a delay module. The delay module 101 includes an even number of inverters 111 connected in sequence, wherein a power supply terminal of the inverter 111 is connected to the reference voltage $V_{ref}$, an input terminal of the inverter 111 at the first position receives the intermediate data, and an output terminal of the inverter 111 at the tail position outputs the intermediate data.

Compared with receiving the intermediate data by the output terminal of the first (that is, at the first position) inverter 111, outputting the intermediate data by the last (that is, at the tail position) inverter 111 has a delay, and a length of the delay is related to a delay time of each inverter 111.

A length of the delay time of the inverter 111 may be adjusted by using the value of the reference voltage $V_{ref}$, to finally adjust the delay of transmitting the intermediate data by the delay module 101, thereby achieving the purpose of changing the length of the delay from reading out the data from the memory cell to outputting the data through the data port DQ. It should be noted that, in some embodiments, sizes of the inverters 111 may be the same, and delay characteristics of the inverters 111 may be the same; and in other embodiments, sizes of the inverters 111 may alternatively be different, and the inverters 111 have different delay characteristics.

Using the even number of inverters 111 connected in sequence to form the delay module 101 can not only realize a function of delaying the transmission of the intermediate data, but also enable the delay module 101 to have a simple circuit structure and occupy a small space of a chip area of the memory chip 100. This is beneficial to reducing the design difficulty of the memory chip 100 and reducing the chip area.

It may be understood that, in another embodiment, another proper delay circuit may alternatively be used as the delay module.

In some embodiments, referring to FIG. 3, the memory chip 100 may further include a scan chain interface 103, wherein the scan chain interface 103 is configured to: obtain the count value based on a command signal sent by a controller, and output the count value to the controller.

Specifically, in some embodiments, the scan chain interface 103 may be used as a medium for transmitting a signal between the controller and the counter 210, and the count value is transmitted to the controller through the scan chain interface 103.

In the technical solution of the memory chip 100 provided in the foregoing embodiment, the delay from reading out the data from the memory cell to transmitting the data to the data port may be adjusted according to the value of the reference voltage, and the value of the reference voltage may be adjusted based on the process corner. In this way, the impact of different process corners on the data transmission delay can be resolved, to ensure that the data transmission delay meets an expectation, thereby preventing a problem of a data signal conflict from occurring.

For example, if the count value represents that the process corner is a fast process corner, a reference voltage of a corresponding memory chip 100 is reduced, such that a speed at which the data is read out from the memory cell and output through the data port is slower, and the delay from reading out the data from the memory cell to outputting the data through the data port is increased; if the count value represents that the process corner is a slow process corner, a reference voltage of a corresponding memory chip 100 is increased, such that a speed at which the data is read out from the memory cell and output through the data port is faster, and the delay from reading out the data from the memory cell to outputting the data through the data port is increased.

Correspondingly, an embodiment of the present disclosure further provides a memory system, wherein the memory system includes the memory chip provided in any one of the foregoing embodiments. The memory system provided in this embodiment of the present disclosure is described in detail below with reference to the accompanying drawings. It should be noted that, for the parts the same as or corresponding to those mentioned in the foregoing embodiments, reference may be made to the detailed descriptions of the foregoing embodiments. Details are not repeated below.

Figure 9:
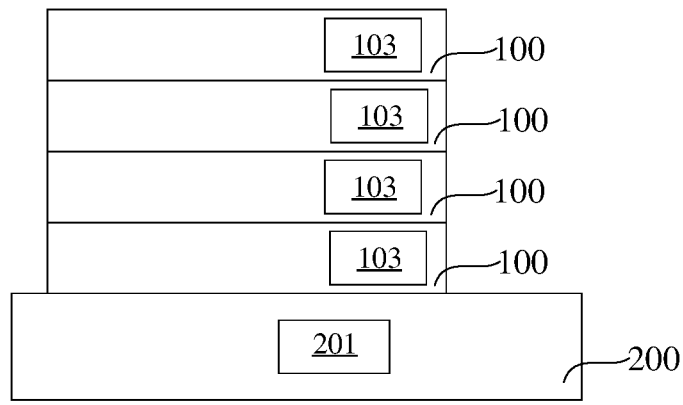
FIG. 9 is a schematic structural diagram of a memory system according to an embodiment of the present disclosure.

FIG. 9 is a schematic structural diagram of a memory system according to an embodiment of the present disclosure.

Referring to FIG. 3 and FIG. 9, the memory system includes: a plurality of memory chips 100 provided in any one of the foregoing embodiments. The memory chip 100 is configured to perform counting and obtain a count value after the memory chip 100 is powered on and started, wherein the count value is used to represent a process corner of the memory chip 100, the memory chip 100 further has a reference voltage $V_{ref}$ with an adjustable value, the value of the reference voltage $V_{ref}$ is adjustable based on the count value, and the memory chip 100 adjusts, based on the reference voltage $V_{ref}$, a delay from reading out data from a memory cell 10 to outputting the data through a data port DQ; and a controller 200, wherein the controller 200 is configured to: obtain the count value of the memory chip 100, and adjust, based on the count value, the value of the reference voltage $V_{ref}$ of the memory chip 100 corresponding to the count value.

The memory system includes the plurality of memory chips 100. Even if a delay from reading out data from a memory cell to outputting the data through a data port DQ is pre-designed for each of different memory chips 100 of the memory system, since the memory chips 100 still have a problem of different process corners, there is still a problem that a data readout delay deviates from that in the pre-design. However, in this embodiment of the present disclosure, the controller 200 further obtains a count value that can represent a process corner of each memory chip 100, and adjusts a reference voltage $V_{ref}$ of the memory chip 100 according to the count value corresponding to the process corner, that is, the reference voltage $V_{ref}$ is compensated according to the process corner, to adjust a delay of the memory chip 100 from reading out data from a memory cell to outputting the data through a data port DQ, such that an actually showed data readout delay conforms to that in the pre-design, thereby preventing a problem of a conflict between data transmission corresponding to the different memory chips 100 from occurring, and improving storage performance of the memory system.

In some embodiments, referring to FIG. 9, the memory chip 100 may include: a ring oscillator 110; and a counter 210, wherein the counter 210 is connected to the ring oscillator 110, and is configured to count an oscillation period of the ring oscillator 110 to obtain the count value within a preset time. The controller 200 is connected to the ring oscillator 110 and the counter 210, and is configured to control the ring oscillator 110 to start to oscillate and obtain the count value.

Specifically, in some examples, an enable signal TM of the ring oscillator 110 may be sent out through the controller 200.

In some embodiments, referring to FIG. 9, the memory chip 100 may further include a scan chain interface 103, wherein the scan chain interface 103 is configured to: obtain the count value based on a command signal sent by the controller 200, and output the count value to the controller 200; and the controller 200 further includes a parameter obtaining module 201, wherein the parameter obtaining module 201 is configured to: send the command signal to the scan chain interface 103, and receive the count value output through the scan chain interface 103.

Specifically, the parameter obtaining module 201 sends the command signal to the scan chain interface 103, the scan chain interface 103 obtains the count value of the counter 210 after receiving the command signal, then the count value is transmitted to the parameter obtaining module 201 through the scan chain interface 103, and the controller 200 generates a corresponding control signal Con after obtaining the count value.

Figure 10:
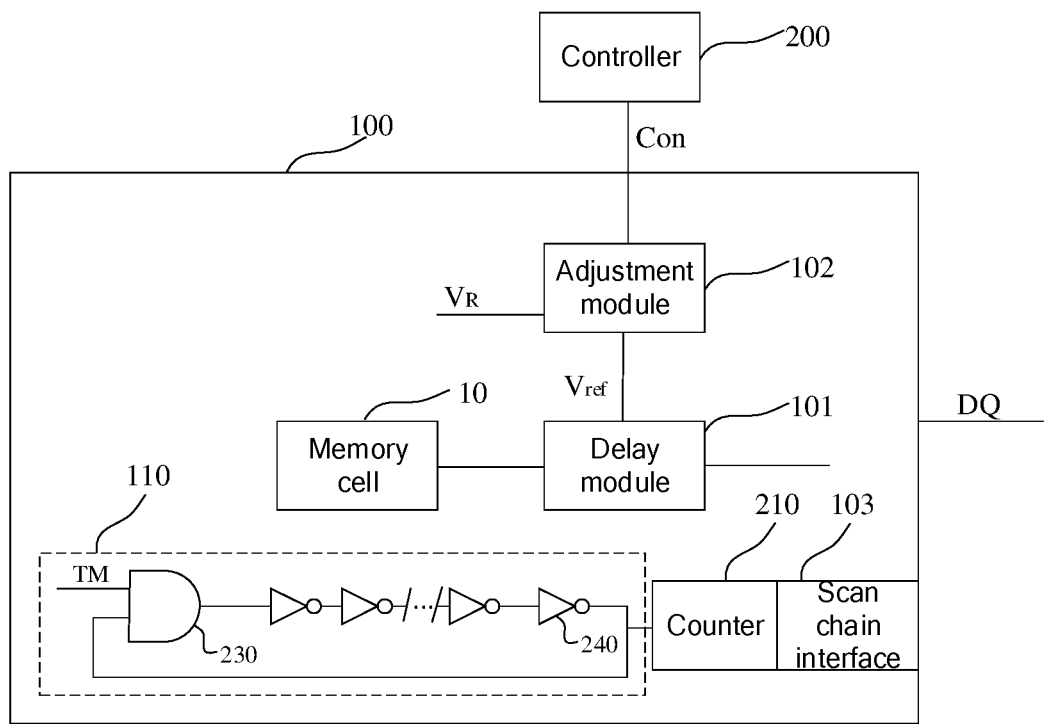
FIG. 10 is a schematic diagram of a functional module that is of a memory chip and a controller that are of a memory system according to an embodiment of the present disclosure.

FIG. 10 is a schematic diagram of a functional module of a memory chip and a controller. Referring to FIG. 10, in some embodiments, the data has a readout path, the readout path includes a process from reading out the data from the memory cell 10 to outputting the data through the data port DQ, and the data transmitted on the readout path is defined as intermediate data; and the memory chip 100 includes: a delay module 101, wherein the delay module 101 is provided on the readout path, an input terminal receives the intermediate data, a control terminal receives the reference voltage $V_{ref}$, an output terminal outputs the intermediate data based on the reference voltage $V_{ref}$, and a length of the delay of the delay module 101 from receiving the intermediate data to outputting the intermediate data corresponds to the value of the reference voltage $V_{ref}$; and an adjustment module 102, wherein an output terminal of the adjustment module 102 is connected to the control terminal of the delay module 101, an input terminal receives a preset reference voltage $V_R$, a control terminal receives a control signal Con, and the output terminal outputs, based on the control signal Con and the preset reference voltage $V_R$, the reference voltage $V_{ref}$ with the adjustable value, wherein the controller 200 is connected to the control terminal of the adjustment module 102, and the controller 200 is configured to: obtain the count value and generate the control signal Con based on the count value.

For the delay module 101, refer to the corresponding detailed descriptions of the foregoing embodiments. Details are not repeated herein.

Specifically, different control signals Con correspond to different count values, and different control signals correspond to reference voltages $V_{ref}$ with different values. The controller 200 generates a corresponding control signal Con based on a count value, such that the memory chip 100 obtains a reference voltage $V_{ref}$ corresponding to the count value.

Figure 11:
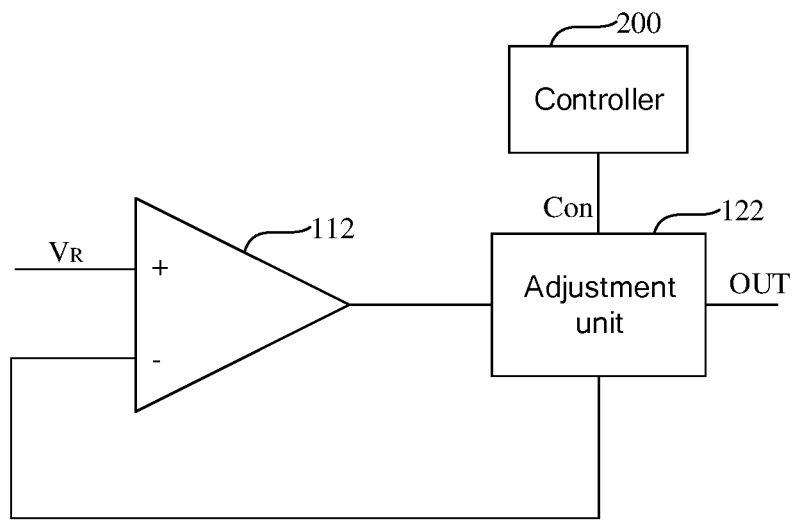
FIG. 11 is a schematic structural diagram of an adjustment module and a controller that are of a memory system according to an embodiment of the present disclosure.

As shown in FIG. 11, FIG. 11 is a schematic structural diagram of an adjustment module and a controller. In some embodiments, the adjustment module 102 may include an operational amplifier 112, wherein a positive input terminal of the operational amplifier 112 receives the preset reference voltage $V_R$, and an adjustment unit 122, wherein the adjustment unit 122 is connected to a negative input terminal and an output terminal of the operational amplifier 112, and an output terminal OUT of the adjustment unit 122 outputs the reference voltage $V_{ref}$, and further adjusts, based on the control signal Con, a value of an equivalent resistance between the output terminal OUT of the adjustment unit 122 and the output terminal of the operational amplifier 112, or a value of an equivalent resistance between the output terminal OUT of the adjustment unit 122 and a ground terminal, wherein the controller 200 is connected to the adjustment unit 122 and provides the control signal to the adjustment unit 122.

Specifically, the value of the equivalent resistance between the output terminal OUT of the adjustment unit 122 and the output terminal of the operational amplifier 112, and/or the value of the equivalent resistance between the output terminal OUT of the adjustment unit 122 and the ground terminal are determined by the control signal Con sent by the controller 200.

As shown in FIG. 5, in some embodiments, the adjustment unit 122 may include N first resistors r1 connected in series between the negative input terminal and the output terminal of the operational amplifier 112, wherein N is an integer greater than 1, and at least one second resistor r2, wherein the second resistor r2 is connected between the negative input terminal and the ground terminal; and M first switches k1, wherein the first switch k1 connects the output terminal OUT of the adjustment unit 122 and a terminal of a corresponding first resistor r1, and the first switch k1 is selectively turned on based on the control signal Con, to adjust the value of the equivalent resistance between the output terminal OUT of the adjustment unit 122 and the output terminal of the operational amplifier 112, wherein M is a positive integer less than or equal to N, wherein the controller 200 is connected to the M first switches k1.

In addition, the first switch k1 is further connected between the negative input terminal of the operational amplifier 112 and the output terminal OUT of the adjustment unit 122. The first switch k1 is selectively turned on according to the control signal Con, that is, the controller 200 sends a corresponding independent control signal Con to each first switch k1 to select a first switch k1 to be turned on, thereby adjusting the value of the equivalent resistance between the output terminal OUT of the adjustment unit 122 and the output terminal of the operational amplifier 112, and further adjusting the value of the reference voltage $V_{ref}$.

Referring to FIG. 6, in some embodiments, the adjustment unit 122 further includes: X second resistors r2 connected in series between the negative input terminal of the operational amplifier 112 and the ground terminal, wherein X is a positive integer greater than 1; and Y second switches k2, wherein the second switch k2 connects the output terminal OUT of the adjustment unit 122 and a terminal of a corresponding second resistor r2, and the second switch k2 is selectively turned on based on the control signal Con, to adjust the value of the equivalent resistance between the output terminal OUT of the adjustment unit 122 and the ground terminal, wherein Y is a positive integer less than or equal to X, wherein the controller 200 is connected to the Y second switches k2.

The second switch k2 is selectively turned on according to the control signal Con, that is, the controller 200 sends a corresponding independent control signal Con to each second switch k2 to select a second switch k2 to be turned on, thereby adjusting the value of the equivalent resistance between the output terminal OUT of the adjustment unit 122 and the ground terminal, and further adjusting the value of the reference voltage $V_{ref}$.

It may be understood that, in some embodiments, as shown in FIG. 7, the adjustment unit 122 may include only one type of the first switch k1 or the second switch k2, and in other embodiments, the adjustment unit 122 may alternatively include both the first switch k1 and the second switch k2.

It should be additionally noted that, as shown in the foregoing embodiments, regarding the design of the adjustment unit 122, only the value of the equivalent resistance between the output terminal OUT of the adjustment unit 122 and the output terminal of the operational amplifier 112 may be adjusted, only the value of the equivalent resistance between the output terminal OUT of the adjustment unit 122 and the ground terminal may be adjusted, or both the value of the equivalent resistance between the output terminal OUT of the adjustment unit 122 and the output terminal of the operational amplifier 112 and the value of the equivalent resistance between the output terminal OUT of the adjustment unit 122 and the ground terminal are adjusted. For specific circuit implementation, refer to the descriptions of the foregoing embodiments. Details are not repeated herein.

In some embodiments, the controller 200 is configured to: if the count value represents a fast process corner, generate the control signal Con used to control the reference voltage $V_{ref}$ to be less than a standard reference voltage, or if the count value represents a slow process corner, generate the control signal Con used to control the reference voltage $V_{ref}$ to be greater than a standard reference voltage.

The standard reference voltage may be a pre-designed ideal reference voltage of the memory chip 100. In an ideal case, a delay of the memory chip 100 from reading data from a memory cell to transmitting the data to a data port under the standard reference voltage meets an expectation. If the count value represents a fast process corner, the control signal generated by the controller 200 can make the value of the reference voltage $V_{ref}$ smaller than the standard reference voltage, that is, the reference voltage $V_{ref}$ of the memory chip 100 with the fast process corner is compensated. In this case, the delay from reading out the data from the memory cell to transmitting the data to the data port is longer than that before the compensation. In this way, a problem of a fast transmission speed caused by the fast process corner can be compensated for, such that the delay from reading out the data from the memory cell to transmitting the data to the data port meets the expectation better, that is, the delay after the compensation tends to be consistent with the delay under the ideal case (that is, in the pre-design). If the count value represents a slow process corner, the control signal generated by the controller 200 can make the value of the reference voltage $V_{ref}$ greater than the standard reference voltage, that is, the reference voltage $V_{ref}$ of the memory chip 100 with the slow process corner is compensated. In this case, the delay from reading out the data from the memory cell to transmitting the data to the data port is shorter than that before the compensation. In this way, a problem of a slow transmission speed caused by the slow process corner can be compensated for, such that the delay from reading out the data from the memory cell to transmitting the data to the data port meets the expectation better, that is, the delay after the compensation tends to be consistent with the delay under the ideal case. In this way, timing sequences of data signals output from data ports in different memory chips 100 do not conflict. This is beneficial to improving performance of the memory system.

In addition, in some embodiments, if the count value represents a standard process corner, the reference voltage $V_{ref}$ of the corresponding memory chip 100 may be the same as the standard reference voltage.

In some embodiments, the controller 200 is configured to: each time after the memory system is powered on and started, obtain the count value of each memory chip 100, and adjust the value of the reference voltage $V_{ref}$ of the memory chip 100 corresponding to the count value, until count values of all of the memory chips 100 are obtained through polling and values of reference voltages $V_{ref}$ of all of the memory chips 100 are adjusted.

Specifically, after the memory system is powered on and started, first, the controller 200 sends out an enable signal TM to the memory chip 100, such that the ring oscillator 110 starts to oscillate, and the counter 210 performs counting on the oscillation period within a preset time period.

The working principle of the controller 200 is described in more detail below.

In an example, the controller 200 may adjust the reference voltage of the memory chip 100 in the following manner: performing a read and write operation test, obtaining a delay of each memory chip 100 from reading out data from a memory cell to transmitting the data to a data port, and obtaining a memory chip 100 whose delay does not meet an expectation; obtaining a count value of the memory chip 100 whose delay does not meet the expectation by using a memory chip 100 whose delay meets the expectation as a standard or by using a memory chip 100 with a standard process corner as a standard, and adjusting a reference voltage of the memory chip 100; and performing the read and write operation test on the adjusted memory chip 100 again, and if a data delay still does not meet a requirement, continuing to adjust the reference voltage of the memory chip 100 until data of the adjusted memory chip 100 meets the requirement.

In a specific example, after the memory system is powered on and started and before the read and write operation test is performed, ring oscillators 110 and counters 210 of all of the memory chips 100 may all start to work, to obtain and store corresponding count values; and after the first time of read and write operation test is performed, the controller 200 obtains a count value of a memory chip 100 whose delay does not meet the expectation. This is beneficial to shortening a time required for the overall test of the memory system.

In another specific example, after the memory system is powered on and started and the first time of read and write test is performed, only a ring oscillator 110 and a counter 210 of a memory chip 100 whose delay does not meet the expectation start to work, to obtain a corresponding count value and send the count value to the controller 200. In this way, counting is performed only for the memory chip 100 whose delay does not meet the expectation. This is beneficial to reducing power consumption of the memory system.

Figure 12:
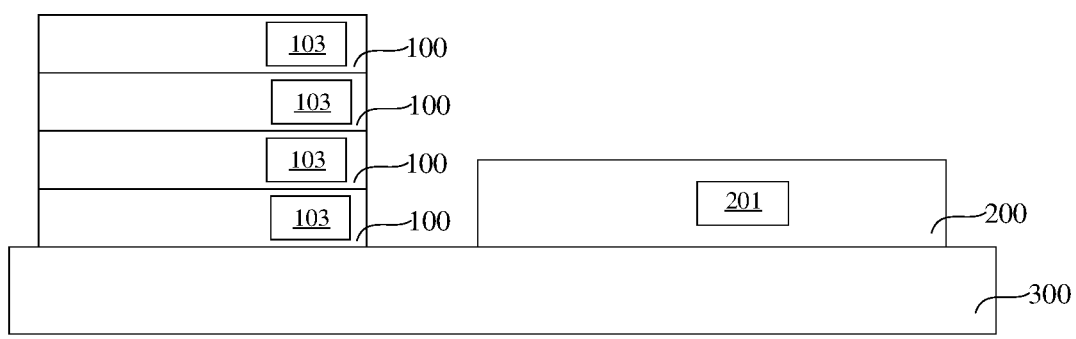
FIG. 12 is another schematic structural diagram of a memory system according to an embodiment of the present disclosure.

As shown in FIG. 9, in some embodiments, a plurality of memory chips 100 are sequentially stacked on a surface of the controller 200, and the memory system is a 3D stacked structure. FIG. 12 is another schematic structural diagram of a memory system according to an embodiment of the present disclosure. In other embodiments, as shown in FIG. 12, the memory system may further include: a carrier substrate 300, wherein the controller 200 is located on a surface of the carrier substrate 300, a plurality of memory chips 100 are sequentially stacked on the surface of the carrier substrate 300, and the memory system forms a 2.5D stacked structure.

The embodiments of the present disclosure provide a memory system with a superior structure and superior performance, wherein a reference voltage for controlling a data transmission speed can be adjusted according to a process corner of a memory chip 100, such that a data transmission delay of each memory chip 100 meets an expectation, thereby improving read and write performance of the memory system.

Those of ordinary skill in the art can understand that the foregoing implementations are specific embodiments for implementing the present disclosure. During actual application, various changes may be made to the foregoing embodiments in terms of form and details without departing from the spirit and scope of the present disclosure. Any person skilled in the art may make changes and modifications without departing from the spirit and scope of the present disclosure. Therefore, the protection scope of the present disclosure should be subject to the scope defined by the claims.

What is claimed is:

1. A memory chip, applied to a memory system, comprising:
the memory chip being configured to perform counting and obtain a count value after the memory chip is powered on and started, wherein the count value is used to characterize a process corner of the memory chip, the memory chip further has a reference voltage with an adjustable value, the value of the reference voltage is adjustable based on the count value, and the memory chip adjusts, based on the reference voltage, a delay from reading out data from a memory cell to outputting the data through a data port.

2. The memory chip according to claim 1, wherein the memory chip comprises:
a ring oscillator; and
a counter, wherein the counter is connected to the ring oscillator, and is configured to count an oscillation period of the ring oscillator within a preset time to obtain the count value.

3. The memory chip according to claim 1, wherein the memory chip further comprises a scan chain interface, wherein the scan chain interface is configured to: obtain the count value based on a command signal sent by a controller, and output the count value to the controller.

4. The memory chip according to claim 1, wherein the data has a readout path, the readout path comprises a process from reading out the data from the memory cell to outputting the data through the data port, and the data transmitted on the readout path is defined as intermediate data; and the memory chip comprises:
a delay module, wherein the delay module is provided on the readout path, an input terminal receives the intermediate data, a control terminal receives the reference voltage, an output terminal outputs the intermediate data based on the reference voltage, and a length of the delay of the delay module from receiving the intermediate data to outputting the intermediate data corresponds to the value of the reference voltage; and
an adjustment module, wherein an output terminal of the adjustment module is connected to the control terminal of the delay module, an input terminal receives a preset reference voltage, a control terminal receives a control signal, and the output terminal outputs, based on the control signal and the preset reference voltage, the reference voltage with the adjustable value.

5. The memory chip according to claim 4, wherein the adjustment module comprises:
an operational amplifier, wherein a positive input terminal of the operational amplifier receives the preset reference voltage; and
an adjustment unit, wherein the adjustment unit is connected to a negative input terminal and an output terminal of the operational amplifier, and an output terminal of the adjustment unit outputs the reference voltage, and further adjusts, based on the control signal, a value of an equivalent resistance between the output terminal of the adjustment unit and the output terminal of the operational amplifier, or a value of an equivalent resistance between the output terminal of the adjustment unit and a ground terminal.

6. The memory chip according to claim 5, wherein the adjustment unit comprises:

N first resistors connected in series between the negative input terminal and the output terminal of the operational amplifier, wherein N is an integer greater than 1, and at least one second resistor, wherein the second resistor is connected between the negative input terminal and the ground terminal; and
M first switches, wherein the first switches each connect the output terminal of the adjustment unit and a terminal of a corresponding first resistor, and the first switches each are selectively turned on based on the control signal, to adjust the value of the equivalent resistance between the output terminal of the adjustment unit and the output terminal of the operational amplifier, wherein M is a positive integer less than or equal to N.

7. The memory chip according to claim 5, wherein the adjustment unit comprises:
X second resistors connected in series between the negative input terminal and the ground terminal, wherein X is a positive integer greater than 1; and
Y second switches, wherein the second switches each connect the output terminal of the adjustment unit and a terminal of a corresponding second resistor, and the second switches each are selectively turned on based on the control signal, to adjust the value of the equivalent resistance between the output terminal of the adjustment unit and the ground terminal, wherein Y is a positive integer less than or equal to X.

8. The memory chip according to claim 4, wherein the delay module comprises:
an even number of inverters connected in sequence, wherein a power supply terminal of the inverter is connected to the reference voltage, an input terminal of the inverter at the first position receives the intermediate data, and an output terminal of the inverter at the tail position outputs the intermediate data.

9. A memory system, comprising:
a plurality of memory chips, comprising: the memory chip being configured to perform counting and obtain a count value after the memory chip is powered on and started, wherein the count value is used to characterize a process corner of the memory chip, the memory chip further has a reference voltage with an adjustable value, the value of the reference voltage is adjustable based on the count value, and the memory chip adjusts, based on the reference voltage, a delay from reading out data from a memory cell to outputting the data through a data port; and
a controller, wherein the controller is configured to: obtain the count value of the memory chip, and adjust, based on the count value, the value of the reference voltage of the memory chip corresponding to the count value.

10. The memory system according to claim 9, wherein the memory chip comprises:
a ring oscillator; and
a counter, wherein the counter is connected to the ring oscillator, and is configured to count an oscillation period of the ring oscillator within a preset time to obtain the count value, wherein
the controller is connected to the ring oscillator and the counter, and is configured to control the ring oscillator to start to oscillate and obtain the count value.

11. The memory system according to claim 10, wherein the memory chip further comprises a scan chain interface, wherein the scan chain interface is configured to: obtain the count value based on a command signal sent by the controller, and output the count value to the controller; and the controller further comprises:
  an obtaining module, wherein the obtaining module is configured to: send the command signal to the scan chain interface, and receive the count value output through the scan chain interface.

12. The memory system according to claim 9, wherein the controller is configured to: each time after the memory system is powered on and started, obtain the count value of each the memory chip, and adjust the value of the reference voltage of the memory chip corresponding to the count value, until count values of all of the memory chips are obtained through polling and values of reference voltages of all of the memory chips are adjusted.

13. The memory system according to claim 9, wherein the data has a readout path, the readout path comprises a process from reading out the data from the memory cell to outputting the data through the data port, and the data transmitted on the readout path is defined as intermediate data; and the memory chip comprises:
  a delay module, wherein the delay module is provided on the readout path, an input terminal receives the intermediate data, a control terminal receives the reference voltage, an output terminal outputs the intermediate data based on the reference voltage, and a length of the delay of the delay module from receiving the intermediate data to outputting the intermediate data corresponds to the value of the reference voltage; and
  an adjustment module, wherein an output terminal of the adjustment module is connected to the control terminal of the delay module, an input terminal receives a preset reference voltage, a control terminal receives a control signal, and the output terminal outputs, based on the control signal and the preset reference voltage, the reference voltage with the adjustable value, wherein
  the controller is connected to the control terminal of the adjustment module, and the controller is configured to: obtain the count value and generate the control signal based on the count value.

14. The memory system according to claim 13, wherein the adjustment module comprises:
  an operational amplifier, wherein a positive input terminal of the operational amplifier receives the preset reference voltage; and
  an adjustment unit, wherein the adjustment unit is connected to a negative input terminal and an output terminal of the operational amplifier, and an output terminal of the adjustment unit outputs the reference voltage, and further adjusts, based on the control signal, a value of an equivalent resistance between the output terminal of the adjustment unit and the output terminal of the operational amplifier, or a value of an equivalent resistance between the output terminal of the adjustment unit and a ground terminal, wherein
  the controller is connected to the adjustment unit, and provides the control signal for the adjustment unit.

15. The memory system according to claim 14, wherein the adjustment unit comprises:
  N first resistors connected in series between the negative input terminal and the output terminal of the operational amplifier, wherein N is an integer greater than 1, and at least one second resistor, wherein the second resistor is connected between the negative input terminal and the ground terminal; and
  M first switches, wherein the first switches each connect the output terminal of the adjustment unit and a terminal of a corresponding first resistor, and the first switches each are selectively turned on based on the control signal, to adjust the value of the equivalent resistance between the output terminal of the adjustment unit and the output terminal of the operational amplifier, wherein M is a positive integer less than or equal to N, wherein
  the controller is connected to the M first switches.

16. The memory system according to claim 14, wherein the adjustment unit comprises:
  X second resistors connected in series between the negative input terminal and the ground terminal, wherein X is a positive integer greater than 1; and
  Y second switches, wherein the second switches each connect the output terminal of the adjustment unit and a terminal of a corresponding second resistor, and the second switches each are selectively turned on based on the control signal, to adjust the value of the equivalent resistance between the output terminal of the adjustment unit and the ground terminal, wherein Y is a positive integer less than or equal to X, wherein
  the controller is connected to the Y second switches.

17. The memory system according to claim 13, wherein the controller is configured to: if the count value represents a fast process corner, generate the control signal used to control the reference voltage to be less than the preset reference voltage, or if the count value represents a slow process corner, generate the control signal used to control the reference voltage to be greater than the preset reference voltage.

18. The memory system according to claim 9, wherein the plurality of the memory chips are sequentially stacked on a surface of the controller; or the memory system further comprises a carrier substrate, wherein the controller is located on a surface of the carrier substrate, and the plurality of the memory chips are sequentially stacked on the surface of the carrier substrate.

* * * * *